United States Patent [19]

Kumanoya et al.

[11] Patent Number: 4,719,597
[45] Date of Patent: Jan. 12, 1988

[54] DRIVING CIRCUIT FOR A SHARED SENSE AMPLIFIER WITH INCREASED SPEED CLOCK GENERATION CIRCUIT FOR READING ADDRESSED MEMORY CELLS

[75] Inventors: Masaki Kumanoya; Kazuyasu Fujishima; Hideshi Miyatake; Hideto Hidaka; Katsumi Dosaka, all of Itami, Japan

[73] Assignee: Mitsubishi Denki Kabushiki Kaisha, Tokyo, Japan

[21] Appl. No.: 766,279

[22] Filed: Aug. 16, 1985

[30] Foreign Application Priority Data

Aug. 17, 1984 [JP] Japan .................... 59-172004

[51] Int. Cl.$^4$ .................... G11C 7/00; G11C 8/00; G11C 7/02
[52] U.S. Cl. .................... 365/189; 365/233; 365/207; 307/482
[58] Field of Search ............. 365/233, 207, 208, 189; 307/482, 578

[56] References Cited

U.S. PATENT DOCUMENTS 4,606,010 8/1986 Saito .................... 365/233

FOREIGN PATENT DOCUMENTS 57-92486 6/1982 Japan .................... 365/189
59-95728 6/1984 Japan .................... 307/482

OTHER PUBLICATIONS

Smith et al., IEEE Journal of Solid-State Circuits, vol. SC-15, No. 2, Apr. 1980, pp. 184–189.
Barnes et al., IEEE Journal of Solid-State Circuits, vol. SC-15, No. 5, Oct. 1980, pp. 831–839.

Primary Examiner—Stuart N. Hecker
Assistant Examiner—Alfonso Garcia
Attorney, Agent, or Firm—Lowe, Price, Leblanc, Becker & Shur

[57] ABSTRACT

A cut-off clock $\phi_5$ generated by a cut-off clock generation circuit PG is supplied to a decode circuit DEC. The decode circuit DEC decodes the cut-off clock $\phi_5$ to produce two types of cut-off clocks $\phi_{5L}$ and $\phi_{5R}$. The two types of cut-off clocks $\phi_{5L}$ and $\phi_{5R}$ are supplied to a control clock generation circuit as shown in FIG. 3 or 11, which in turn produces control clocks $\phi_{2L}$ and $\phi_{2R}$. The control clocks $\phi_{2L}$ and $\phi_{2R}$ are supplied to a shared sense amplifier of FIG. 1, to control on-off operations of transfer transistors $7_L$, $8_L$, $7_R$ and $8_R$.

16 Claims, 12 Drawing Figures

DRIVING CIRCUIT FOR A SHARED SENSE AMPLIFIER WITH INCREASED SPEED CLOCK GENERATION CIRCUIT FOR READING ADDRESSED MEMORY CELLS

BACKGROUND OF THE INVENTION

1. Field of the Invention

The present invention relates to a driving circuit for a shared sense amplifier, and more particularly, it relates to a circuit for driving a sense amplifier shared by two pairs of bit lines at a high speed.

2. Description of the Prior Art

FIG. 1 shows an example of a shared sense amplifier to which the present invention can be applied. In FIG. 1, a clock $\phi_3$ is supplied to respective sources of transistors 1 and 2. The drain of the transistor 1 is connected to a sense node 9 while the gate thereof is connected to a sense node 10. On the other hand, the drain of the transistor 2 is connected to the sense node 10 while the gate thereof is connected to the sense node 9. These transistors 1 and 2 form a flip-flop type sense amplifier.

One end of the sense node 9 is connected to a bit line $3_R$ through a transfer transistor $7_R$ while the other end thereof is connected to a bit line $3_L$ through a transfer transistor $7_L$. One end of the sense node 10 is connected to a bit line $4_R$ through a transfer transistor $8_R$ while the other end thereof is connected to a bit line $4_L$ through a transfer transistor $8_L$. The transfer transistors $7_R$ and $8_R$ are adapted to connect and cut off the bit lines $3_R$ and $4_R$ on the right side with and from the sense amplifier, and are on-off controlled by a control clock $\phi_{2R}$. Similarly, the transfer transistors $7_L$ and $8_L$ are adapted to connect and cut off the bit lines $3_L$ and $4_L$ on the left side with and from the sense amplifier, and are on-off controlled by a control clock $\phi_{2L}$. The bit lines $3_R$ and $4_R$ form a pair of folded bit lines while the bit lines $3_L$ and $4_L$ similarly form another pair of folded bit lines. In the shared sense amplifier circuit as shown in FIG. 1, the sense amplifier, which is formed by the transistors 1 and 2, is shared by the two pairs of folded bit lines.

The bit lines $3_R$ and $4_R$ on the right side of FIG. 1 are respectively connected with sources of transistors $5_R$ and $6_R$. Precharge voltage $V_R$ is applied to respective drains of the transistors $5_R$ and $6_R$ while a precharge clock $\phi_{1R}$ is supplied to respective gates thereof. These transistors $5_R$ and $6_R$ are adapted to charge the bit lines $3_R$ and $4_R$ at the precharge voltage $V_R$ in response to the precharge clock $\phi_{1R}$ respectively. The bit lines $3_R$ and $4_R$ are further connected with memory cells $MC_{1R}$ and $MC_{NR}$ respectively. The storage content of the memory cell $MC_{1R}$ is read on the bit line $3_R$ when a word line $WL_{1R}$ is selected while the storage content of the memory cell $MC_{NR}$ is read on the bit line $4_R$ when a word line $WL_{NR}$ is selected. The bit lines $3_R$ and $4_R$ are further connected with dummy memory cells $DC_{1R}$ and $DC_{2R}$. With respect to the dummy memory cell $DC_{1R}$, intermediate potential between read out potential of information "0" and that of information "1" is read on the bit line $3_R$ when a dummy word line $DWL_{1R}$ is selected, while the said intermediate potential is read on the bit line $4_R$ when a dummy word line $DWL_{2R}$ is selected with respect to the dummy memory cell $DC_{2R}$.

Elements similar to those connected with the bit lines $3_R$ and $4_R$ are connected with the bit lines $3_L$ and $4_L$ on the left side. The elements corresponding to the aforementioned ones are indicated by the same reference numerals, except for that the subscripts "R" are replaced by "L", and detailed description thereof is herein omitted.

The bit lines $3_L$ and $4_L$ on the left side are connected with read/write lines $I/O_1$ and $I/O_2$ respectively through transfer transistors 11 and 12. A clock $\phi_4$ is supplied to respective gates of the transfer transistors 11 and 12.

Although merely four word lines $WL_{1R}$, $WL_{NR}$, $WL_{1L}$ and $WL_{NL}$ are shown in FIG. 1, a number N (arbitrarily selected even number) of word lines are present on each side in practice while the number N of memory cells $MC_{1R}$ ($MC_{1L}$) to $MC_{NR}$ are connected with the bit lines $3_R$ ($3_L$) and $4_R$ ($4_L$) by N/2 respectively.

Although the circuit as shown in FIG. 1 employs only one sense amplifier, a practical memory is generally formed by a plurality of sense amplifiers which are vertically aligned to form arrays of memory cells.

Description is now made on a circuit having one sense amplifier and two word lines, for easy understanding of the present invention.

FIG. 2 is a timing chart of an NMOS employed for illustrating the operation of the circuit as shown in FIG. 1.

In a standby state to a time $T_1$, the precharge clock $\phi_{1L}$ is at a high level, whereby the transistors $5_L$ and $6_L$ are in ON states and the bit lines $3_L$ and $4_L$ are charged at the precharge voltage $V_L$. The precharge clock $\phi_{1R}$ is also at a high level, whereby the bit lines $3_R$ and $4_R$ are charged at the precharge voltage $V_R$ through the transistors $5_R$ and $6_R$. During this period, the clock $\phi_3$ for inactivating the sense amplifier is at a high level, whereby the sense amplifier is retained in the standby state. Assuming here that either of the memory cells $MC_{1R}$ and $MC_{NR}$ on the right side of the sense amplifier is addressed by address data (not shown), the potential of either word line $WL_{1R}$ or $WL_{NR}$ and that of either dummy word line $DWL_{1R}$ or $DWL_{2R}$ are increased, while the non-selected word line $WL_{1L}$ or $WL_{NL}$ and dummy word line $DWL_{1L}$ or $DWL_{2L}$ remain at low levels.

The potential levels at the selected word line and dummy word line are not immediately increased upon the addressing performed by the address data. This is because the address data are supplied to a decoder (not shown), which increases the potential levels at the selected word line and dummy word line, whereby the increase in the potential levels of the word line and dummy word line is delayed from the addressing by the time required for processing in the decoder.

Description is now made on the case where, for example, the word line $WL_{1R}$ and dummy word line $DWL_{2R}$ are selected.

Upon input of the address data, the control clock $\phi_{2L}$ is turned to a low level at a time $T_2$ before increase of the potential levels at the word line $WL_{1R}$ and dummy word line $DWL_{2R}$, whereby the transfer transistors $7_L$ and $8_L$ are both made nonconductive. Thus, the sense nodes 9 and 10 are electrically cut off from the bit lines $3_L$ and $4_L$, and the potential levels at the word line $WL_{1R}$ and dummy word line $DWL_{2R}$ are increased at a time $T_3$. Then, information stored in the memory cell $MC_{1R}$ is read on the bit line $3_R$ and the charge stored in the dummy memory cell $DC_{2R}$ is read on the bit line $4_R$ respectively. The read information is transferred to the sense nodes 9 and 10 through the transfer transistors $7_R$ and $8_R$ during the period when the control clock $\phi_{2R}$ is at a high level to a time $T_4$. The level of the control clock $\phi_{2R}$ slightly drops at the time $T_4$ while impedance levels of the transfer transistors $7_R$ and $8_R$ are increased. When the clock $\phi_3$ is turned to a low level at a time $T_5$, the sense amplifier formed by the transistors 1 and 2 is activated and the information transferred to the sense nodes 9 and 10 is amplified. The amplified information is returned to the bit lines $3_R$ and $4_R$ respectively through the transfer transistors $7_R$ and $8_R$, to be re-written in the memory cell being selected. The control clock $\phi_{2L}$ is again turned to a high level at a time $T_6$, whereby the amplified information is transferred to the bit lines $3_L$ and $4_L$ through the transfer transistors $7_L$ and $8_L$.

The clock $\phi_4$ is turned to a high level at a time $T_7$, and the amplified information is transferred to the read/write lines $I/O_1$ and $I/O_2$ through the transfer transistors 11 and 12. The word line $WL_{1R}$, dummy word line $DWL_{2R}$ and clock $\phi_4$ return to low levels at a time $T_8$ and the clocks $\phi_{1R}$, $\phi_{1L}$, $\phi_3$ and $\phi_{2R}$ are turned to high levels at a time $T_9$, whereby the folded bit lines on both sides are charged at $V_R$ and $V_L$ respectively, and the sense amplifier returns to a standby state.

The sequential read/write operation is performed in the aforementioned manner. The impedance levels of the transfer transistors $7_R$ and $8_R$ are so increased in amplification of the sense amplifier as to reduce capacitive loads at the sense nodes 9 and 10 thereby to increase amplification sensitivity.

When the memory cells $MC_{1L}$ and $MC_{NL}$ on the left side are selected, the waveforms of the control clocks $\phi_{2L}$ and $\phi_{2R}$ change places with each other.

As hereinabove described, the sense amplifier as shown in FIG. 1 is driven to be shared by two pairs of folded bit lines.

As obvious from the foregoing description, the waveforms of the control clocks $\phi_{2R}$ and $\phi_{2L}$ have important functions for driving the shared sense amplifier. Particularly the control clock on the non-selected side ($\phi_{2L}$ in the above case) must be immediately turned to a low level before the potential levels at the selected word lines rise upon the addressing of the memory cells by the address data, i.e., before read-out of the memory cells, to cut off the non-selected bit lines from the sense amplifier. Slow fall of the control clock on the non-selected side delays the read-out from the memory cells, whereby high-speed read-out is disabled. Thus, awaited is implementation of a driving circuit for a shared sense amplifier which can attain high-speed readout operation by quickly connecting and cutting off bit lines with and from the sense amplifier.

SUMMARY OF THE INVENTION

An object of the present invention is to provide a driving circuit for a sense amplifier shared by two pairs of bit lines which can connect and cut off the bit lines with and from the sense amplifier at a high speed thereby to drive the shared sense amplifier at a high speed.

Briefly stated, the present invention provides a circuit for driving at a high speed a shared sense amplifier including two pairs of bit lines respectively connected with memory cells, a sense amplifier positioned between the two pairs of bit lines for amplifying information read from the memory cells, first switch means interposed between one of the pairs of bit lines and the sense amplifier and second switch means interposed between the other pair of bit lines and the sense amplifier thereby to share the sense amplifier by the two pairs of bit lines, and the driving circuit comprises a cut-off clock generation circuit, a decoder and an control clock generation circuit. The cut-off clock generation circuit is adapted to generate a cut-off clock which responds at a high speed to addressing of the memory cells, and the decoder is adapted to decode the cut-off clock from the cut-off clock generation circuit while the control clock generation circuit is adapted to generate a control clock for controlling the on-off operation of the first switch means and a control clock for controlling the on-off operation of the second switch means on the basis of the output from the decoder. The aforementioned cut-off clock generation circuit includes a first potential level source, a second potential level source, a first transistor whose conducting terminal is connected at one end to the first potential level source, a second transistor interposed between the other end of the conducting terminal of the first transistor and the second potential source, a first circuit means for making the first transistor conductive and the second transistor non-conductive in response to addressing of the memory cell, a capacitor means for boosting interposed between the other end of the conducting terminal and the gate terminal of the first transistor and a second circuit means for producing a cut-off clock on the basis of potential change at the other end of the conducting terminal of the first transistor.

Generated according to the present invention is the cut-off clock which responds at a high speed to the addressing to produce a control clock from the cut-off clock, thereby to control on-off operations of the first and second switch means by the control clock, and hence the bit lines on the non-selected side can be cut off from the sense amplifier immediately upon the addressing of the memory cell. Therefore, even if the time interval from the addressing of the memory cell to actual read-out of the information in the memory cell is extremely short, the bit lines on the non-selected side can reliably be cut off from the sense amplifier within the short interval, thereby to attain high-speed driving of the shared sense amplifier.

The above and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
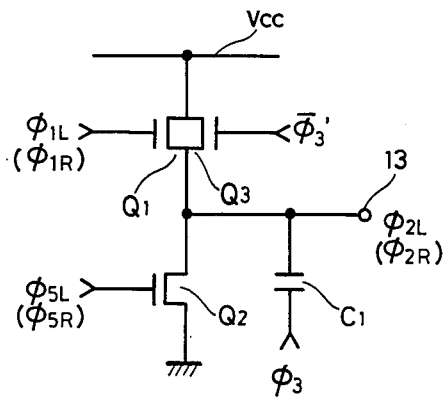
FIG. 3 is a circuit diagram showing a part of a control clock generation circuit according to an embodiment of the present invention.

FIG. 3 shows a part of a control clock generation circuit according to an embodiment of the present invention. In FIG. 3, the said circuit includes transistors $Q_1$ to $Q_3$ and a capacitor $C_1$. The transistors $Q_1$ and $Q_3$ are connected in parallel with each other, and respective drains thereof receive supply voltage $V_{CC}$. The gate of the transistor $Q_1$ receives a precharge clock $\phi_{1L}$ while the gate of the transistor $Q_3$ receives an inverted delay clock $\overline{\phi_3'}$, which is an inverted delay signal of the clock $\phi_3$. Respective sources of the transistors $Q_1$ and $Q_3$ are connected in common to an output terminal 13 and grounded through the drain and source of the transistor $Q_2$. The output terminal 13 outputs a control clock $\phi_{2L}$. The gate of the transistor $Q_2$ receives a cut-off clock $\phi_{5L}$ as hereinafter described. One end of the capacitor $C_1$ receives the clock $\phi_3$ while the other end thereof is connected with the output terminal 13.

FIG. 3 shows the circuit for generating the control clock $\phi_{2L}$, and a circuit for generating a clock $\phi_{2R}$ is in similar structure to that shown in FIG. 3, except for that a precharge clock $\phi_{1R}$ is supplied in place of the precharge clock $\phi_{1L}$ and a cut-off clock $\phi_{5R}$ is supplied in place of the cut-off clock $\phi_{5L}$.

Figure 4:
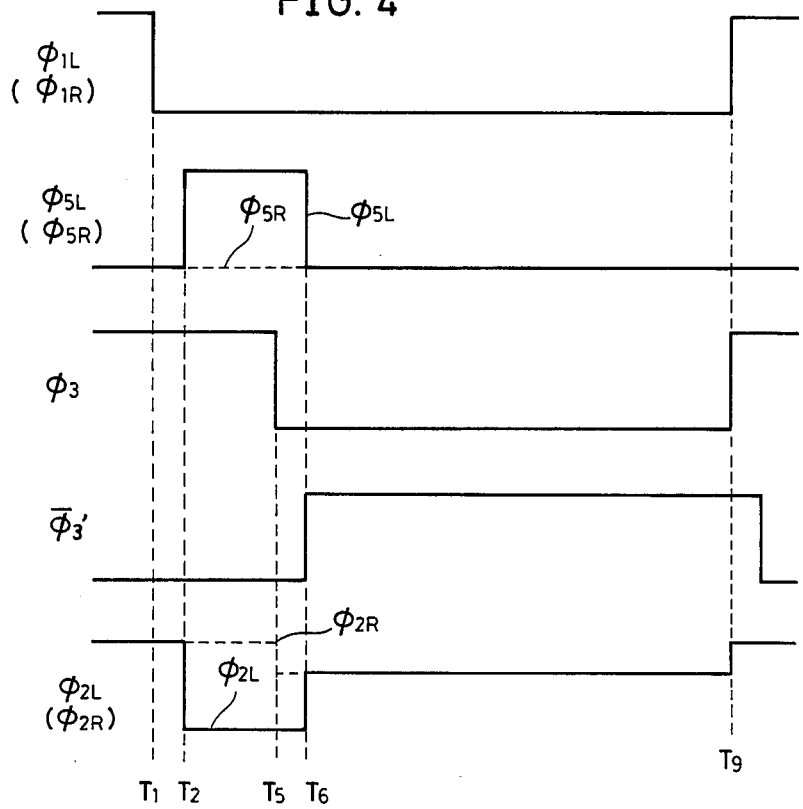
FIG. 4 is a timing chart for illustrating the operation of the circuit as shown in FIG. 3.

FIG. 4 is a timing chart for illustrating the operation of the circuit as shown in FIG. 3. Referring now to FIG. 4, description is made on the operation of the circuit as shown in FIG. 3, in the case where addressed is the memory cell on the right side of the sense amplifier as shown in FIG. 1.

In the standby state to the time $T_1$, the clocks $\phi_{1L}$ and $\phi_3$ are at high levels, and the output terminal 13 and, thus, the control clock $\phi_{2L}$ are precharged at higher levels than the supply voltage $V_{CC}$ by capacitive coupling of the capacitor $C_1$ as hereinafter described. Then, at the time $T_1$, the precharge clock $\phi_{1L}$ is turned to a low level and the transistor $Q_1$ is turned off, while the control clock $\phi_{2L}$ is retained at a high level until the cut-off clock $\phi_{5L}$ is turned to a high level at a time $T_2$. At the time $T_2$, the cut-off clock $\phi_{5L}$ is turned to a high level whereby the transistor $Q_2$ is turned on to ground the output terminal 13. Therefore, the control clock $\phi_{2L}$ falls to a low level. At a time $T_5$, the clock $\phi_3$ is turned to a low level. And at a time $T_6$, the inverted delay clock $\overline{\phi_3'}$ is turned to a high level whereby the transistor $Q_3$ is turned on. At this time, the cut-off clock $\phi_{5L}$ drops to a low level, whereby the transistor $Q_2$ is turned off and the control clock $\phi_{2L}$ rises to the supply voltage $V_{CC}$. At a time $T_9$, the clock $\phi_3$ is turned to a high level, whereby the control clock $\phi_{2L}$ is boosted to the precharge level by capacitive coupling of the capacitor $C_1$.

On the other hand, in the circuit for generating the control clock $\phi_{2R}$, the control clock $\phi_{2R}$ is retained at a high level to the time $T_2$ similarly to the aforementioned control clock $\phi_{2L}$. However, the cut-off clock $\phi_{5R}$ still remains at a low level at the time $T_2$, and hence the control clock $\phi_{2R}$ is retained at a high level. At the time $T_5$, the clock $\phi_3$ falls to a low level, whereby the level of the control clock $\phi_{2R}$ is lowered to the supply voltage $V_{CC}$ by capacitive coupling of the capacitor $C_1$. Then, at the time $T_9$, the clock $\phi_3$ is turned to a high level, whereby the control clock $\phi_{2R}$ is boosted to the original precharge level by capacitive coupling of the capacitor $C_1$.

Figure 1:
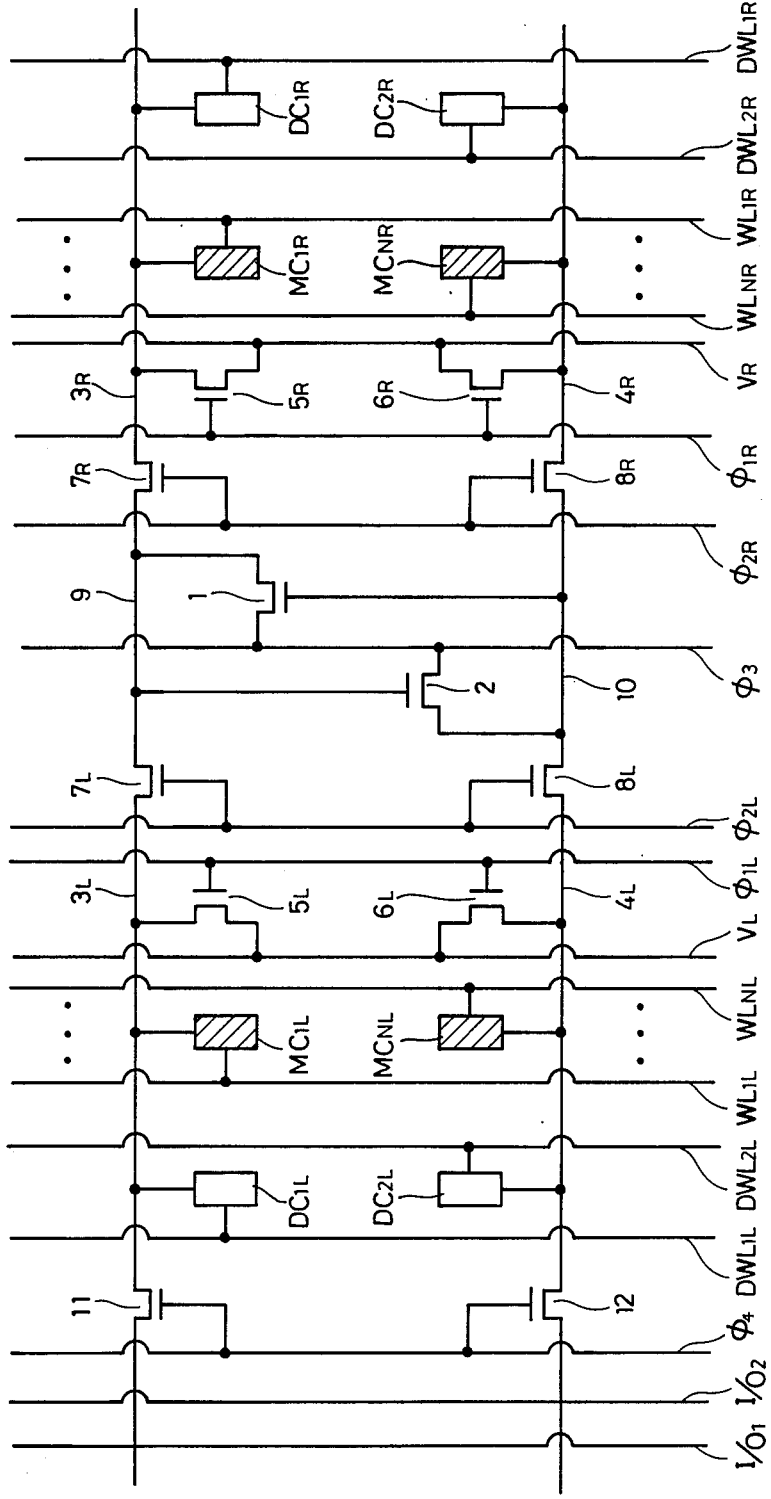
FIG. 1 is a circuit diagram showing an example of a shared sense amplifier to which the present invention can be applied.
Figure 2:
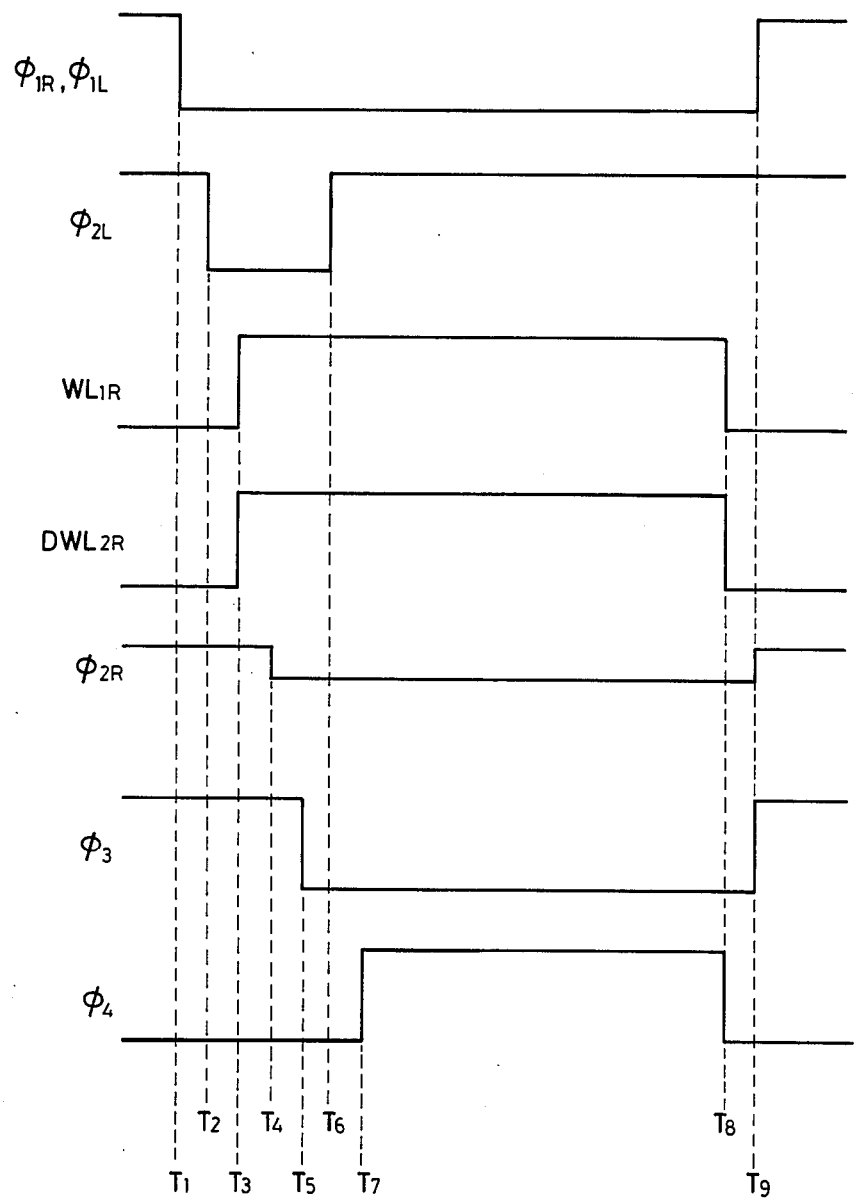
FIG. 2 is a timing chart for illustrating the operation of the circuit as shown in FIG. 1.

In the case where the memory cell on the left side of the sense amplifier as shown in FIG. 1 is selected, simply the operation of the circuit for generating the control clock $\phi_{2L}$ as hereinabove described is replaced by that of the circuit for generating the control clock $\phi_{2R}$.

In order to make the control clock $\phi_{2L}$ or $\phi_{2R}$ fall at a high speed, required is a circuit for making the cut-off clock $\phi_{5L}$ or $\phi_{5R}$ fall at a high speed. Description is now made on an example of structure of such a circuit.

Figure 5:
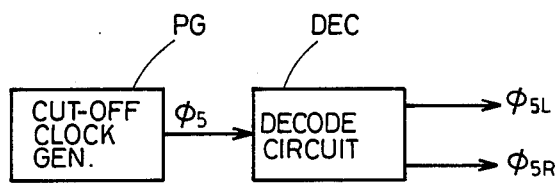
FIG. 5 is a block diagram showing a circuit for generating a cut-off clock to be supplied to the circuit as shown in FIG. 3.

FIG. 5 is a block diagram showing a circuit for generating a cut-off clock to be supplied to the circuit as shown in FIG. 3.

The circuit as shown in FIG. 5 is formed by two portions of a cut-off clock generation circuit PG for generating a cut-off clock $\phi_5$ at high-speed responsive to the addressing of the memory cells by the address data and a decode circuit for decoding the clamp clock $\phi_5$ thereby to generate two types of cut-off clock $\phi_{5L}$ and $\phi_{5R}$.

Figure 6:
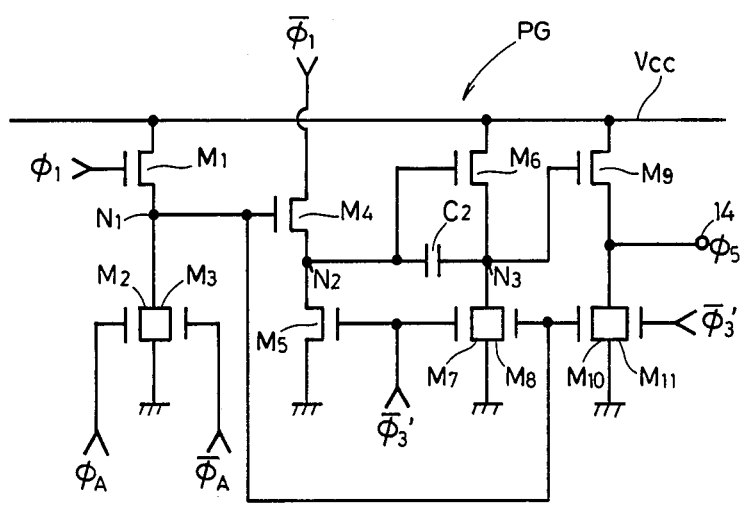
FIG. 6 is a diagram showing an example of definite circuit structure of the cut-off clock generation circuit as shown in FIG. 5.

FIG. 6 is a circuit diagram showing an example of definite structure of the cut-off clock generation circuit PG as shown in FIG. 5. In FIG. 6, the circuit includes transistors $M_1$ to $M_{11}$ and a capacitor $C_2$. The drain of the transistor $M_1$ receives the supply voltage $V_{CC}$ and the gate receives the precharge clock $\phi_1$ while the source is connected to a node $N_1$. The drain of the transistor $M_2$ is connected to the node $N_1$ and the gate receives a first address clock $\phi_A$ while the source is grounded. The drain of the transistor $M_3$ is connected to the node $N_1$ while the gate receives a second address clock $\overline{\phi_A}$ and the source is grounded. The drain of the transistor $M_4$ receives an inverted precharge clock $\overline{\phi_1}$ which is an inverted signal of the precharge clock $\phi_1$ and the gate is connected with the node $N_1$ while the source is connected with a node $N_2$. The drain of the transistor $M_5$ is connected with the node $N_2$ and the gate receives the inverted delay clock $\overline{\phi_3'}$ while the source is grounded. The drain of the transistor $M_6$ receives the supply voltage $V_{CC}$ and the gate is connected to the node $N_2$ while the source is connected to a node $N_3$. The drain of the transistor $M_7$ is connected with the node $N_3$ while the gate receives the inverted delay clock $\overline{\phi_3'}$ and the source is grounded. The drain of the transistor $M_8$ is connected with the node $N_3$ and the gate is connected with the node $N_1$ while the source thereof is grounded. The drain of the transistor $M_9$ receives the supply voltage $V_{CC}$ while the gate is connected with the node $N_3$ and the source is connected with an output terminal 14, which outputs the cut-off clock $\phi_5$. The drain of the transistor $M_{10}$ is connected with the output terminal 14 and the gate is connected with the node $N_1$, while the source is grounded. The drain of the transistor $M_{11}$ is connected with the output terminal 14, while the gate receives the inverted delay clock $\overline{\phi_3'}$, and the source is grounded. One end of the capacitor $C_2$ is connected with the node $N_2$ and the other end thereof is connected with the node $N_3$.

Either of the precharge clocks $\phi_{1L}$ and $\phi_{1R}$ as shown in FIG. 1 may serve as the precharge clock $\phi_1$. Or, alternatively, an address strobe signal may be employed in place of the precharge clock $\phi_1$. Further, the first and second address clocks $\phi_A$ and $\overline{\phi_A}$ are formed by partial bits extracted from the address data for addressing the memory cell, and the first address clock $\phi_A$ indicates addressing of the memory cell on the right side of the sense amplifier in FIG. 1 while the second address clock $\overline{\phi_A}$ indicates addressing of the memory cell on the left side of the sense amplifier in FIG. 1. In other words, the first address clock $\phi_A$ is turned to a high level when the memory cell on the right side is addressed while the second address clock $\overline{\phi_A}$ is turned to a high level when the memory cell on the left side is addressed.

Figure 7:
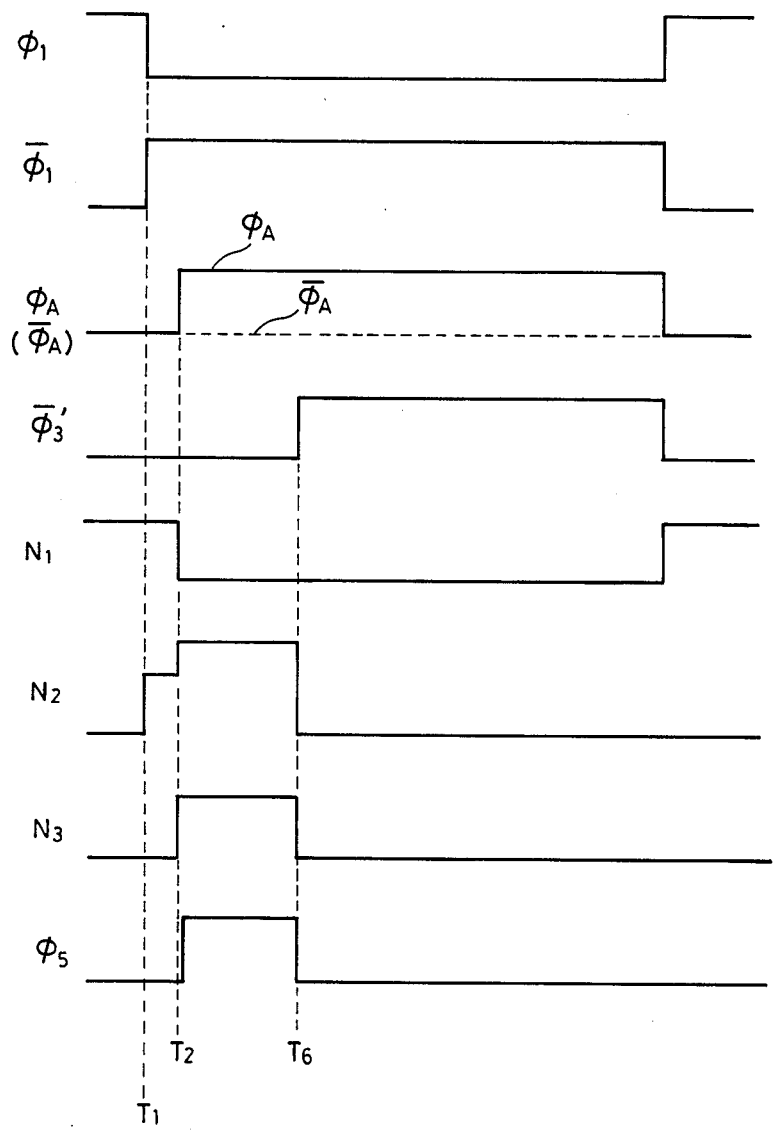
FIG. 7 is a timing chart for illustrating the operation of the circuit as shown in FIG. 6.

FIG. 7 is a timing chart for illustrating the operation of the circuit as shown in FIG. 6. The operation of the circuit in FIG. 6 is now described with reference to FIG. 7. In the standby state to the time $T_1$, the precharge clock $\phi_1$ is at a high level and the node $N_1$ is precharged at a high level through the transistor $M_1$. Therefore, the transistors $M_4$, $M_8$ and $M_{10}$ are in ON states and the nodes $N_2$ and $N_3$ and cut-off clock $\phi_5$ are at low levels. At the time $T_1$, the precharge clock $\phi_1$ is turned to a low level and the inverted precharge clock $\overline{\phi_1}$ is turned to a high level whereby the transistor $M_1$ is turned off while the node $N_1$ remains at a high level, and hence the transistor $M_4$ is retained in an ON state. Therefore, the high-level inverted precharge clock $\overline{\phi_1}$ is supplied to the node $N_2$, which is turned to a high level whereby the transistor $M_6$ is turned on. However, since the node $N_1$ remains at a high level, the transistor $M_8$ is retained in an ON state and the node $N_3$ is retained at a low level. At the time $T_2$, either the first or second address clock $\phi_A$ or $\overline{\phi_A}$ is turned to a high level whereby either the transistor $M_2$ or $M_3$ is turned on to turn the node $N_1$ to a low level. Therefore, the transistor $M_4$ is turned off and the node $N_2$ enters a high floating state. On the other hand, the transistors $M_8$ and $M_{10}$ are turned off whereby the level of the node $N_3$ begins to be increased. Then the node $N_2$ is boosted to a higher level by capacitive coupling of the capacitor $C_2$, whereby the transistor $M_6$ is strongly turned on to increase the voltage at the node $N_3$ to the level of the supply voltage $V_{CC}$ at a high speed. Thus, the transistor $M_9$ is turned on to turn the cut-off clock $\phi_5$ to a high level at a high speed. Then, at the time $T_6$, the inverted delay lock $\overline{\phi_3'}$ is turned to a high level, whereby the transistors $M_5$, $M_7$ and $M_{11}$ are turned on to turn the nodes $N_2$ and $N_3$ and cut-off clock $\phi_5$ to low levels. Although the inverted delay clock $\overline{\phi_3'}$ is employed in this embodiment to reset the circuit, such reset operation may be performed by other types of reset clocks.

According to the circuit of FIG. 6 as hereinabove described, generated is the clamp clock $\phi_5$ which responds at a high speed to the first or second address clock $\phi_A$ or $\overline{\phi_A}$.

Figure 8:
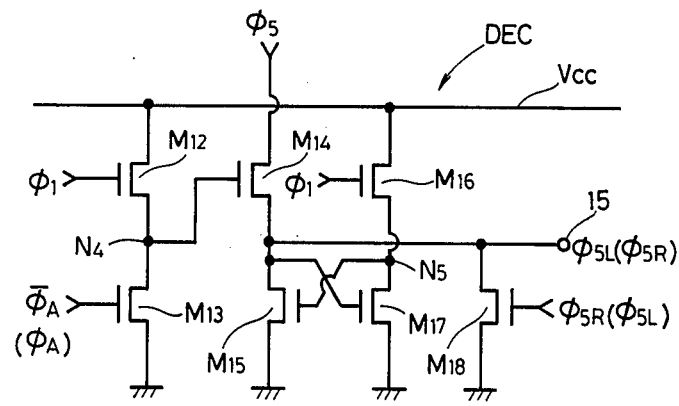
FIG. 8 is a diagram showing an example of definite circuit structure of a decode circuit as shown in FIG. 5.

FIG. 8 is a circuit diagram showing an example of definite structure of the decode circuit DEC as shown in FIG. 5, particularly the structure of a circuit for producing the cut-off clock $\phi_{5L}$. The circuit as shown in FIG. 8 includes transistors $M_{12}$ to $M_{18}$. The drain of the transistor $M_{12}$ receives the supply voltage $V_{CC}$ while the gate receives the precharge clock $\phi_1$ and the source is connected with a node $N_4$. The drain of the transistor $M_{13}$ is connected to the node $N_4$ while the gate receives a second address clock $\overline{\phi_A}$ and the source is grounded. The drain of the transistor $M_{14}$ receives the cut-off clock $\phi_5$ from the circuit as shown in FIG. 6 while the gate is connected with the node $N_4$ and the source is connected with an output terminal 15, which outputs the cut-off clock $\phi_{5L}$. The drain of the transistor $M_{15}$ is connected with the output terminal 15 and the gate is connected with a node $N_5$ while the source is grounded. The drain of the transistor $M_{16}$ receives the supply voltage $V_{CC}$ and the gate receives the precharge clock $\phi_1$ while the source is connected with the node $N_5$. The drain of the transistor $M_{17}$ is connected with the node $N_5$ and the gate is connected with the output terminal 15 while the source is grounded. The drain of the transistor $M_{18}$ is connected with the output terminal 15 while the gate receives a cut-off clock $\phi_{5R}$ and the source is grounded.

A circuit for producing the cut-off clock $\phi_{5R}$ (similarly included in the decode circuit) is in similar structure to the aforementioned circuit as shown in FIG. 8, except for that the first address clock $\phi_A$ is supplied in place of the second address clock $\overline{\phi_A}$ and the cut-off clock $\phi_{5L}$ is supplied in place of the cut-off clock $\phi_{5R}$.

Figure 9:
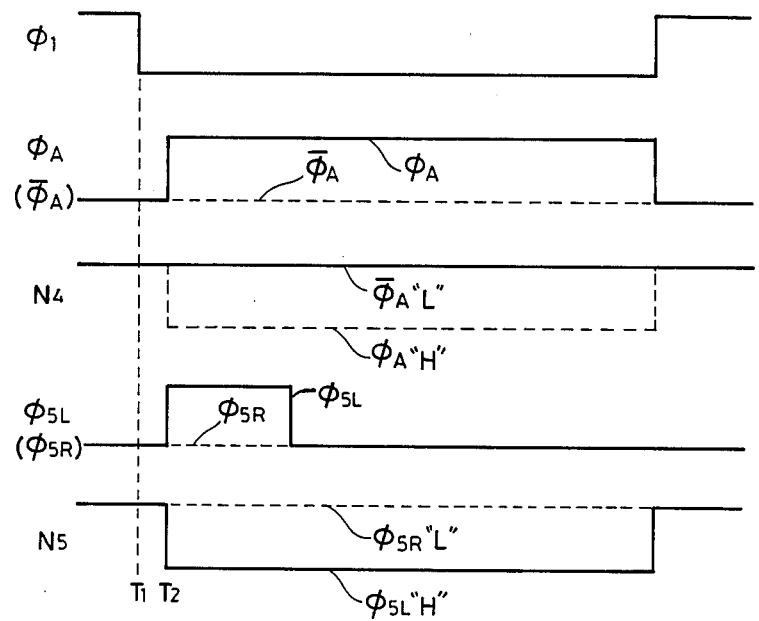
FIG. 9 is a timing chart for illustrating the operation of the circuit as shown in FIG. 8.

FIG. 9 is a timing chart for illustrating the operation of the circuit as shown in FIG. 8. The operation of the circuit in FIG. 8 is now described with reference to FIG. 9, on such case that the memory cell on the right side of the sense amplifier in FIG. 1 is addressed.

In the standby state to the time $T_1$, the precharge clock $\phi_1$ is at a high level. Therefore, the transistors $M_{12}$ and $M_{16}$ are in ON states and the nodes $N_4$ and $N_5$ are precharged at high levels. Thus, the transistors $M_{14}$ and $M_{15}$ are turned on and the output terminal 15 and, thus, the cut-off clock $\phi_{5L}$ at low levels. If the memory cell on the right side in FIG. 1 is addressed at the time $T_2$, the first address clock $\phi_A$ is turned to a high level while the second address clock $\overline{\phi_A}$ remains at a low level. Therefore, the node $N_4$ is retained at a high level at the time $T_2$, thereby to retain the transistor $M_{14}$ in an ON state. Thus, the level of the cut-off clock $\phi_5$ is directly transmitted to the output terminal 15, and the cut-off clock $\phi_{5L}$ presents the same waveform as that of the cut-off clock $\phi_5$. At this time, the transistor $M_{17}$ is turned on to turn the node $N_5$ to a low level, whereby the transistor $M_{15}$ is in an OFF state.

On the other hand, in the circuit for producing the cut-off clock $\phi_{5R}$, the first address clock $\phi_A$ rises to a high level at the time $T_2$, whereby the transistor $M_{13}$ is turned on and the node $N_4$ is turned to a low level while the transistor $M_{14}$ is cut off. Thus, the level of the cut-off clock $\phi_5$ is not transmitted to the output terminal 15, and the transistor $M_{17}$ is not turned on. Therefore, the transistor $M_{15}$ remains in an ON state and the cut-off clock $\phi_{5R}$ is retained at a low level. Further, during the period when the cut-off clock $\phi_{5L}$ is at a high level, the transistor $M_{18}$ is in an ON state whereby the cut-off clock $\phi_{5R}$ is securely retained at a low level state at least in the high-level period of the cut-off clock $\phi_{5L}$.

In the case where the memory cell on the left side of the circuit as shown in FIG. 1 is selected, the operation of the circuit for producing the cut-off clock $\phi_{5L}$ is simply replaced by the operation of that for producing the cut-off clock $\phi_{5R}$.

Figure 10:
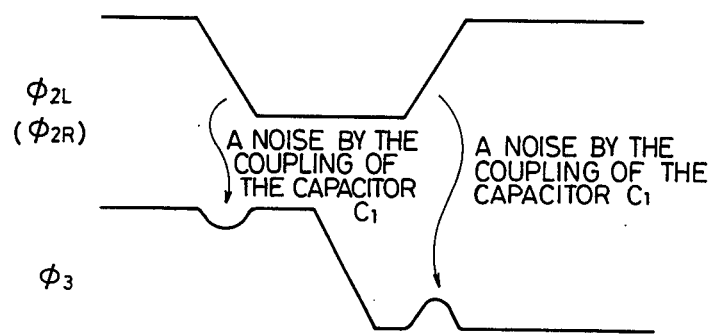
FIG. 10 is a waveform diagram for illustrating problems caused when the circuit as shown in FIG. 3 is employed.

In the case where the circuit as shown in FIG. 3 is employed, it is necessary to pull out the charge stored in the capacitor $C_1$ when the transistor $Q_2$ is turned on to make the control clock $\phi_{2L}$ ($\phi_{2R}$) drop to a low level, and the dropping to the low level is delayed by the pull-out time. Further, as shown in FIG. 10, when the level of the control clock $\phi_{2L}$ ($\phi_{2R}$) is changed, the clock $\phi_3$ may include a noise by the coupling of the capacitor $C_1$. Description is now made on an example of circuit structure which overcomes the problems in the circuit of FIG. 3 and enables the cut-off operation at a higher speed with no noise being included in the clock $\phi_3$.

Figure 11:
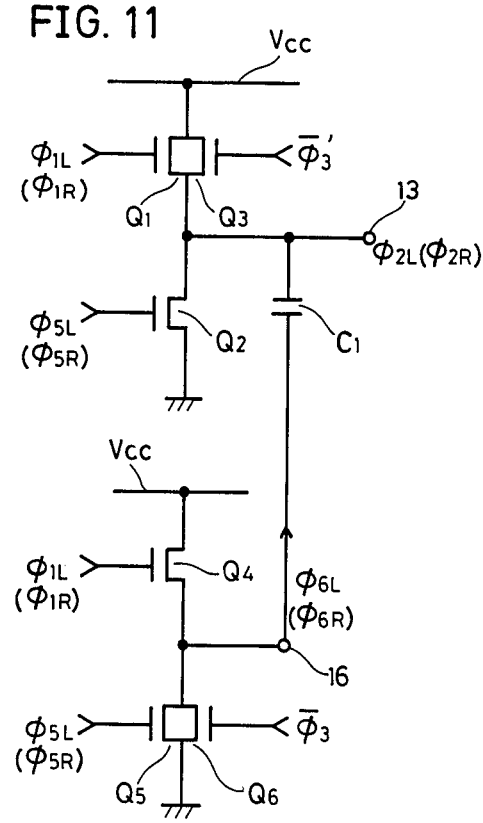
FIG. 11 is a circuit diagram showing another example of the control clock generation circuit.

FIG. 11 shows an example of structure of a circuit which is improved to overcome the problems caused in the circuit as shown in FIG. 3. In the circuit as shown in FIG. 11, a clock $\phi_{6L}$ ($\phi_{6R}$) is supplied in place of the clock $\phi_3$ supplied to the capacitor $C_1$ in FIG. 3. The clock $\phi_{6L}$ ($\phi_{6R}$) is produced by transistors $Q_4$ to $Q_6$. The drain of the transistor $Q_4$ receives supply voltage $V_{CC}$ and the gate receives a precharge clock $\phi_1$ while the source is connected with an output terminal 16, which outputs the clock $\phi_{6L}$ ($\phi_{6R}$). The drain of the transistor $Q_5$ is connected with the output terminal 16 and the gate receives the clock $\phi_{5L}$ ($\phi_{5R}$) while the source is grounded. The drain of the transistor $Q_6$ is connected with the output terminal 16 while the gate receives a clock $\overline{\phi_3}$, which is an inverted signal of the aforementioned clock $\phi_3$ and the source is grounded. The clock $\phi_{6L}$ ($\phi_{6R}$) outputted from the output terminal 16 is supplied to a capacitor $C_1$.

Figure 12:
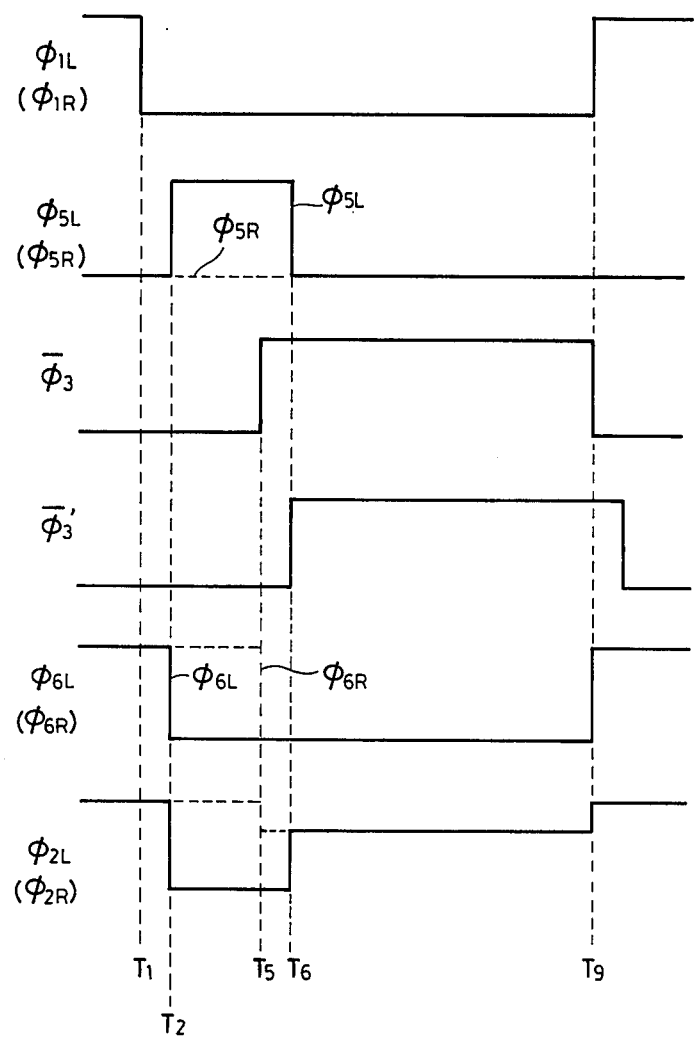
FIG. 12 is a timing chart for illustrating the operation of the circuit as shown in FIG. 11.

FIG. 12 is a timing chart for illustrating the operation of the circuit as shown in FIG. 11. Description is now made on the operation of the circuit of FIG. 11 with reference to FIG. 12.

The operation of the circuit for producing the control clock $\phi_{2L}$ is now described. In the standby state to the time $T_1$, the precharge clock $\phi_1$ is at a high level and the clocks $\overline{\phi_3}$ and $\phi_5$ are at low levels. Therefore, the transistors $Q_1$ and $Q_4$ are in ON states while the transistors $Q_2$, $Q_5$ and $Q_6$ are in OFF states. Thus, the control clock $\phi_{2L}$ and clock $\phi_{6L}$ are retained at high levels. At the time $T_1$, the precharge clock $\phi_1$ is turned to a low level and the transistors $Q_1$ and $Q_4$ are turned off, whereas the clocks $\phi_{2L}$ and $\phi_{6L}$ are retained at high levels since the transistors $Q_2$, $Q_5$ and $Q_6$ are retained in OFF states. Then, at the time $T_2$, the cut-off clock $\phi_{5L}$ is turned to a high level and the transistors $Q_2$ and $Q_5$ are turned on, whereby the control clock $\phi_{2L}$ and $\phi_{6L}$ drop to low levels. At this time, the charge stored in the capacitor $C_1$ is pulled out from both sides of the output terminals 13 and 16, whereby the control clock $\phi_{2L}$ is made to drop to a low level at a higher speed than that in the circuit shown in FIG. 3. The operation thereafter is similar to that of the circuit as shown in FIG. 3.

Description is now made on the circuit for producing the control clock $\phi_{2R}$. Similarly to the aforementioned clocks $\phi_{2L}$ and $\phi_{6L}$, the control clocks $\phi_{2R}$ and $\phi_{6R}$ are retained at high levels to the time $T_2$. Since the cut-off clock $\phi_{5R}$ is still at a low level at the time $T_2$, the control clock $\phi_{2R}$ and the clock $\phi_{6R}$ remain at high levels. At the time $T_5$, the clock $\phi_3$ drops to a low level and the inverted clock $\overline{\phi_3}$ thereof is turned to a high level, whereby the transistor $Q_6$ is turned on to make the clock $\phi_{6R}$ drop to a low level. Therefore, the level of the control clock $\phi_{2R}$ is slightly lowered by capacitive coupling of the capacitor $C_1$. At the time $T_9$, the precharge clock $\phi_1$ is turned to a high level whereby the transistor $Q_4$ is turned on so that the clock $\phi_{6R}$ is turned to a high level. Thus, the control clock $\phi_{2R}$ is boosted to the original precharge level by capacitive coupling of the capacitor $C_1$.

According to the circuit of FIG. 11 as hereinabove described, the cut-off operation of the bit lines can be performed at a higher speed than the circuit as shown in FIG. 3 while the clock $\phi_3$ is prevented from including any noise. Thus, the shared sense amplifier can be driven at a higher speed by employing the circuit as shown in FIG. 11 in place of that shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A driving circuit for a shared sense amplifier which drives at a high speed a shared sense amplifier circuit including two pairs of bit lines respectively connected with memory cells, sense amplifier means provided between said two pairs of bit lines for amplifying information read from said memory cells, first switch means interposed between one of said pairs of bit lines and said sense amplifier means and second switch means interposed between the other pair of bit lines and said sense amplifier means thereby to share said sense amplifier means by said two pairs of bit lines, said driving circuit comprising:

cut-off clock generation circuit means for generating a cut-off clock responding at a high speed to addressing of said memory cells;

decoder means for decoding said cut-off clock; and a control clock generation circuit means for generating a first control clock for controlling the on-off operation of said first switch means and a second control clock for controlling the on-off operation of said second switch means, said cut-off clock generation circuit means including:

a first potential level source, a second potential level source having a potential level different from that of said first potential level source, a first transistor having a first conducting terminal connected to said first potential level source, a second transistor interposed between a second conducting terminal of said first transistor and said second potential level source, first circuit means for making said first transistor conductive and said second transistor non-conductive in response to addressing of one of said memory cells, boosting capacitor means interposed between said second conducting terminal of said first transistor and a gate terminal of said first transistor for making said first transistor conductive at a high speed, and second circuit means for producing said cut-off clock on the basis of potential change at said second conducting terminal of said first transistor.

2. A driving circuit for a shared sense amplifier in accordance with claim 1, wherein said first potential level source is a positive voltage source and said second potential level source is a ground member.

3. A driving circuit for a shared sense amplifier in accordance with claim 2, wherein said control clock generation circuit means includes further capacitor means for precharging said first and second control clocks at a voltage level exceeding that of said positive voltage source.

4. A driving circuit for a shared sense amplifier in accordance with claim 3, wherein said control clock generation circuit means includes means for forcibly discharging the charge stored in said further capacitor means when said control clock falls.

5. A driving circuit for a shared sense amplifier in accordance with claim 4 wherein said further capacitor means comprises two terminals, and further comprising a pair of discharge means for discharging said further capacitor means via both terminals thereof.

6. A driving circuit for a driving a shared sense amplifier at high speed to read an addressed memory cell, the shared sense amplifier circuit including two pairs of bit lines respectively connected with plural memory cells, sense amplifier means provided between said two pairs of bit lines for amplifying information read from said memory cells, first switch means interposed between one of said pairs of bit lines and said sense amplifier means and second switch means interposed between the other pair of bit lines and said sense amplifier means thereby to share said sense amplifier means by said two pairs of bit lines, said driving circuit comprising:
cut-off clock generation circuit means for generating a cut-off clock responding at a high speed to addressing of said memory cells;
decoder means for decoding said cut-off clock; and
a control clock generation circuit means for generating a first control clock for controlling the on-off operation of said first switch means and a second control clock for controlling the on-off operation of said second switch means,
said cut-off clock generation circuit means including:
a first potential level source,
a second potential level source having a potential level different from that of said first potential level source,
a first transistor having a first conducting terminal connected to said first potential level source,
a second transistor interposed between a second conducting terminal of said first transistor and said second potential level source,
first circuit means for making said first transistor conductive and said second transistor non-conductive in response to addressing of one of said memory cells,
boosting capacitor means interposed between said second conducting terminal of said first transistor and a gate terminal of said first transistor for making said first transistor conductive at a high speed, and
second circuit means for producing said cut-off clock on the basis of potential change at said second conducting terminal of said first transistor,
said first circuit means including a third transistor connected for driving the gate terminal of said first transistor, and
a pair of transistors responsive to address signals connected to address the memory cells to be read, said pair of transistors connected to operate said third transistor to drive the gate terminal of said first transistor in response to said address signals.

7. A driving circuit for a driving a shared sense amplifier at high speed to read an addressed memory cell as recited in claim 6 wherein said pair of transistors are parallel connected, having common connections at respective source and drain terminals thereof, and wherein each of said pair of transistors has a gate terminal, said gate terminals of said pair of transistors respectively driven by complementary address clock signals providing partial bits extracted from address data for the addressed memory cell.

8. A driving circuit for a driving a shared sense amplifier at high speed to read an addressed memory cell as recited in claim 6 wherein said third transistor includes first and second conducting terminals and a gate terminal, said first conducting terminal thereof connected to an address strobe signal, said second conducting terminal thereof connected to said boost capacitor means, and said gate terminal thereof connected to a common conducting terminal of said pair of transistors, and
further comprising a fourth transistor having a first conducting terminal connected to said first potential level source, a second conducting terminal connected to said gate terminal of said third transistor, and a gate terminal connected to a complemented form of said address strobe signal.

9. A driving circuit for a driving a shared sense amplifier at high speed to read an addressed memory cell as recited in claim 8 further comprising a fifth transistor connected between said second conducting terminal of said third transistor and said second potential level source and having a gate terminal connected to a gate terminal of said second transistor.

10. A driving circuit for a driving a shared sense amplifier at high speed to read an addressed memory cell as recited in claim 8 wherein said pair of transistors are parallel connected, having common connections at source and drain terminals thereof, and wherein each of said pair of transistors has a gate terminal, said gate terminals of said pair of transistors respectively driven by complementary address clock signals providing partial bits extracted from address data for the addressed memory cell.

11. A driving circuit for a driving a shared sense amplifier at high speed to read an addressed memory cell as recited in claim 10 wherein said second circuit means comprises a second pair of transistors, said second pair of transistors being parallel connected to one another, and including a further transistor having a gate terminal and first and second conducting terminals, said first conducting terminal thereof connected to said first potential level source, said second conducting terminal thereof connected to a common terminal of said second pair of transistors, and said gate terminal thereof connected to said second conducting terminal of said first transistor.

12. A driving circuit for a driving a shared sense amplifier at high speed to read an addressed memory cell as recited in claim 11 further comprising a fifth transistor connected between said second conducting terminal of said third transistor and said second potential level source and having a gate terminal connected to a gate terminal of said second transistor.

13. A driving circuit for a driving a shared sense amplifier at high speed to read an addressed memory cell as recited in claim 12 further including a sixth transistor parallel connected with said second transistor to have commonly connected respective first and second conducting terminals,
said sixth transistor having a gate terminal connected to said second conducting terminal of said fourth transistor and to said gate terminal of said third transistor.

14. A driving circuit for a driving a shared sense amplifier at high speed to read an addressed memory cell as recited in claim 13 wherein said second pair of transistors includes one transistor having a gate terminal connected to said gate terminal of said sixth transistor and another transistor having a gate terminal connected to be driven by a complemented and delayed representation of a driving clock signal operable for activating and deactivating said shared sense amplifier, said gate terminals of said second and fifth transistors connected to be driven by said complemented and delayed representation of said driving clock signal applied to said gate terminal of said another transistor of said second pair of transistors, an output clock signal of said cut-off clock generation circuit means provided at a junction of said second conducting terminal of said further transistor and said common terminal of said second pair of transistors.

15. In a memory structure utilizing a shared sense amplifier circuit, the shared sense amplifier circuit including two pairs of bit lines respectively connected with plural memory cells, sense amplifier means provided between said two pairs of bit lines for amplifying information read from said memory cells, first switch means interposed between one of said pairs of bit lines and said sense amplifier means and second switch means interposed between the other pair of bit lines and said sense amplifier means thereby to share said sense amplifier means by said two pairs of bit lines, an improved driving circuit comprising:

cut-off clock generation circuit means for generating a cut-off clock responding at a high speed to addressing of said memory cells;

said cut-off clock generation circuit means including:

a first potential level source, a second potential level source having a potential level different from that of said first potential level source, a first transistor having a first conducting terminal connected to said first potential level source, a second transistor interposed between a second conducting terminal of said first transistor and said second potential level source, first circuit means for making said first transistor conductive and said second transistor non-conductive in response to addressing of one of said memory cells, boosting capacitor means interposed between said second conducting terminal of said first transistor and a gate terminal of said first transistor for making said first transistor conductive at a high speed, and second circuit means for producing said cut-off clock on the basis of potential change at said second conducting terminal of said first transistor, said first circuit means including a third transistor connected for driving the gate terminal of said first transistor, and a pair of transistors responsive to address signals connected to address the memory cells to be read, said pair of transistors connected to operate said third transistor to drive the gate terminal of said first transistor in response to said address signals.

16. An improved shared sense amplifier memory structure as recited in claim 15, wherein:

said third transistor includes first and second conducting terminals and a gate terminal, said first conducting terminal thereof connected to an address strobe signal, said second conducting terminal thereof connected to said boost capacitor means, and said gate terminal thereof connected to a common conducting terminal of said pair of transistors, further comprising a fourth transistor having a first conducting terminal connected to said first potential level source, a second conducting terminal connected to said gate terminal of said third transistor, and a gate terminal connected to a complemented form of said address strobe signal, said pair of transistors being parallel connected, having common connections at source and drain terminals thereof, and each of said pair of transistors having a gate terminal, said gate terminals of said pair of transistors respectively driven by complementary address clock signals providing partial bits extracted from address data for the addressed memory cell, said second circuit means including a second pair of transistors, said second pair of transistors being parallel connected to one another, and including a further transistor having a gate terminal and first and second conducting terminals, said first conducting terminal thereof connected to said first potential level source, said second conducting terminal thereof connected to a common terminal of said second pair of transistors, and said gate terminal thereof connected to said second conducting terminal of said first transistor, further including a fifth transistor connected between said second conducting terminal of said third transistor and said second potential level source and having a gate terminal connected to a gate terminal of said second transistor, a sixth transistor parallel connected with said second transistor to have commonly connected respective first and second conducting terminals, said sixth transistor having a gate terminal connected to said second conducting terminal of said fourth transistor and to said gate terminal of said third transistor, said second pair of transistors including one transistor having a gate terminal connected to said gate terminal of said sixth transistor and another transistor having a gate terminal connected to be driven by a complemented and delyaed representation of a driving clock signal operable for activating and deactivating said shared sense amplifier, said gate terminals of said second and fifth transistors connected to be driven by said complemented and delayed representation of said driving clock signal applied to said gate terminal of said another transistor of said second pair of transistors, an output clock signal of said cut-off clock generation circuit means provided at a junction of said second conducting terminal of said further transistor and said common terminal of said second pair of transistors.

* * * * *